United States Patent [19]
Sakamoto et al.

[11] Patent Number: 5,394,120
[45] Date of Patent: Feb. 28, 1995

[54] DEVICE FOR TESTING AN AMPLIFIER

[75] Inventors: Hironori Sakamoto; Akira Ito; Masaaki Fujiwara, all of Mitaka; Toshio Nojima, Yokosuka, all of Japan

[73] Assignees: Japan Radio Co., Ltd.; NTT Mobile Communications Network, Inc., both of Tokyo, Japan

[21] Appl. No.: 217,878

[22] Filed: Mar. 25, 1994

[30] Foreign Application Priority Data

Apr. 13, 1993 [JP] Japan .................... 5-086216

[51] Int. Cl.6 ............................ G01R 19/00
[52] U.S. Cl. ........................ 330/2; 324/620; 330/52; 330/151
[58] Field of Search .......... 330/2, 52, 149, 151; 324/620, 622, 624, 626; 455/67.1, 67.4, 115

[56] References Cited

U.S. PATENT DOCUMENTS 4,028,622  6/1977  Evans et al. ............... 324/624
4,494,238  1/1985  Groth, Jr. .................. 455/52.3
4,885,551  12/1989 Myer ............................ 330/52

FOREIGN PATENT DOCUMENTS 2637270   9/1977  Germany .
1-302901  12/1989 Japan .
2243736   11/1991 United Kingdom .
WO91/16760 10/1991 WIPO .

Primary Examiner—James B. Mullins
Attorney, Agent, or Firm—Oliff & Berridge

[57] ABSTRACT

A device for testing an amplifier. A plurality of PN modulators are provided corresponding to a plurality of oscillators at stages preceding or following them, or fluctuation is given to division ratios at the oscillators. Since each of n carriers combined by a combiner contains phase fluctuation, the possibility that the peaks will overlap each other or that the carriers having opposite phases will negate each other is very low. The peak power in signals supplied to the amplifier to be tested is unlikely to vary, enabling accurate evaluation or testing.

17 Claims, 10 Drawing Sheets

TWO WAVES
HAVING
OPPOSITE PHASE

DEVICE FOR TESTING AN AMPLIFIER

BACKGROUND OF THE INVENTION

1. Field of the Invention

This invention relates to a device for testing or evaluating an amplifier which amplifies frequency components of n waves, n being an integer of 2 or greater, at the same time by supplying the frequency components to the amplifier.

2. Description of the Related Art

For example, a method of simultaneously amplifying a plurality of carriers such as eight, 16, or 24 waves is used in a base station system for mobile communication. FIG. 7 shows a schematic block diagram of a system using such a method.

The system shown in FIG. 7 comprises oscillators 10-1, 10-2 ..., 10-n, a combiner 12, an amplifier 14, and a communication antenna 16. The oscillators 10-1, 10-2, ..., 10-n oscillate at predetermined frequencies $f_1$, $f_2$, ..., $f_n$ respectively. The combiner 12 combines oscillation outputs of the oscillators 10-1, 10-2, ..., 10-n and feeds the combined result into the amplifier 14, which then amplifies it. The amplified result is transmitted through the communication antenna 16. In the system shown in FIG. 7, a plurality of carriers having frequencies $f_1$, $f_2$, ..., $f_n$ are combined and then amplified.

Performance evaluation of such a system, particularly of the amplifier 14 requires a testing device which has a signal source for generating a large number of carriers at the same time. If a testing device appropriate for such an application is designed based on the practical sense of those skilled in the art, the schematic configuration of the testing device will be presented as shown in FIG. 8.

The testing device 18 shown in the figure comprises a reference oscillator 20, oscillators 22-1, 22-2, ..., 22-n, and a combiner 24. Each of the oscillators 22-1, 22-2, ..., 22-n is configured as a PLL (phase locked loop) circuit, for example. The reference oscillator 20 oscillates at a predetermined reference frequency and feeds its oscillation output into the oscillators 22-1, 22-2, ..., 22-n. The oscillators 22-1, 22-2, ..., 22-n use the oscillation output of the reference oscillator 20 as frequency and phase reference and oscillate at their respective predetermined frequencies $f_1$, $f_2$, ..., $f_n$. Each division ratio of the reference frequency at the oscillators 22-1, 22-2, ..., 22-n is set to a predetermined value by a controller (not shown). The combiner 24 combines oscillation outputs of the oscillators 22-1, 22-2, ..., 22-n and supplies the result to the amplifier 14 to be tested.

If the testing device 18 is thus configured as a PLL synthesizer, only one reference oscillator 20 is sufficient to give the reference frequency, simplifying the configuration. On the other hand, since the reference of the oscillation frequencies $f_1$, $f_2$, ..., $f_n$ and oscillation phases of the oscillators 22-1, 22-2, ..., 22-n is given by a single reference oscillator 20, the phase correlation among the oscillators 22-1, 22-2, ..., 22-n becomes strong.

Therefore, a state that peaks in oscillation output waves of the oscillators 22-1, 22-2, ..., 22-n are prone to overlap each other, and a state that any two among output waves of the oscillators 22-1, 22-2, ..., 22-n are prone to have opposite phase to each other, periodically occur. Resultantly, the peak power of signals given to the amplifier 14 to be tested varies remarkably and periodically.

For example, as shown in FIG. 9, if the peaks in oscillation outputs of the oscillators 22-1, 22-2, ..., 22-n overlap each other at the timing indicated by a broken line, the peak power of the signal output from the combiner 24 becomes large. In contrast, if the phases of the oscillation outputs of two oscillators, for example, 22-1 and 22-2 become opposite as shown in FIG. 10, the peak power of the signal output from the combiner 24 becomes small. Note that the average power of the output signals of the combiner 24 does not vary in any states described above.

On the other hand, characteristics such as attenuation of intermodulation distortion of amplification elements making up the amplifier 14 to be tested, for example, transistors, depend largely on the peak power of the input signals. Therefore, if the peak power of the signal source used with the testing device (in FIG. 8, peak power of output of the combiner 24) varies greatly, it becomes difficult to evaluate the performance of the amplifier 14 in a true-to-fact and precise manner.

SUMMARY OF THE INVENTION

Accordingly, it is a first object of the invention to suppress variation of the peak power in signals supplied to an amplifier to be tested.

It is a second object of the invention to enable performance evaluation of an amplifier more accurately.

It is a third object of the invention to accomplish the first and second objects with a comparatively simple circuit configuration.

To these ends, according to one embodiment of the invention, there is provided a testing device comprising:
a) reference oscillation means for generating a reference signal of a predetermined frequency;
b) a plurality of oscillation means for generating test carriers having different frequencies with the reference signal as the phase reference;
c) means for combining the test carriers and supplying the result to the amplifier to be tested; and
d) phase fluctuation means for giving a different fluctuation to each of the phases of the test carriers.

According to another embodiment of the invention, there is provided a testing device comprising:
a) a reference oscillator which oscillates at a predetermined frequency;
b) a plurality of oscillators which use an oscillation output of the reference oscillator as the reference of oscillation phases thereof and oscillate at different frequencies;
c) a combiner which combines oscillation outputs of the oscillators and supplies the result to an amplifier to be tested; and
d) phase fluctuation means for giving a different fluctuation to each of the oscillation output phases of the oscillators, wherein the amplifier is tested or evaluated by supplying a plurality of frequency components at the same time.

According to another aspect of the invention, there is provided a method of testing or evaluating an amplifier comprising the steps of:
a) generating a reference signal of a predetermined frequency;
b) generating test carriers having different frequencies with the reference signal as a phase reference;
c) combining the test carriers and supplying the result to the amplifier to be tested; and d) giving a different fluctuation to each of the phases of the test carriers.

In the invention, test carriers are generated with the reference signal as a phase reference. The test carriers are combined and the result is supplied to the amplifier to be tested. At this time, a different phase fluctuation is given to each of the test carriers. When fluctuation is thus given to the phases of the test carriers, the phase correlation among them becomes weak. As a result, trouble such as an increase in the peak power because of overlapping of peaks or a decrease in the peak power because of addition of opposite phases is much less likely to occur, enabling accurate evaluation of the characteristics and performance such as attenuation of intermodulation distortion of amplifiers.

The configuration of the testing device, particularly, the additional part for giving phase fluctuation may be simple. The phase fluctuation is given by applying random phase or frequency modulation to the test carriers, by applying random phase or frequency modulation to the reference signal before generation of the test carriers, or by giving fluctuation to the division ratios at generation of the test carriers. Therefore, no complicated configuration is required. The modulation can be executed as phase modulation by PN (pseudo noise) code. The fluctuation can be applied to the division ratios without any hardware change.

BRIEF DESCRIPTION OF THE DRAWINGS In the accompanying drawings.

DESCRIPTION OF THE PREFERRED EMBODIMENTS

Figure 8:
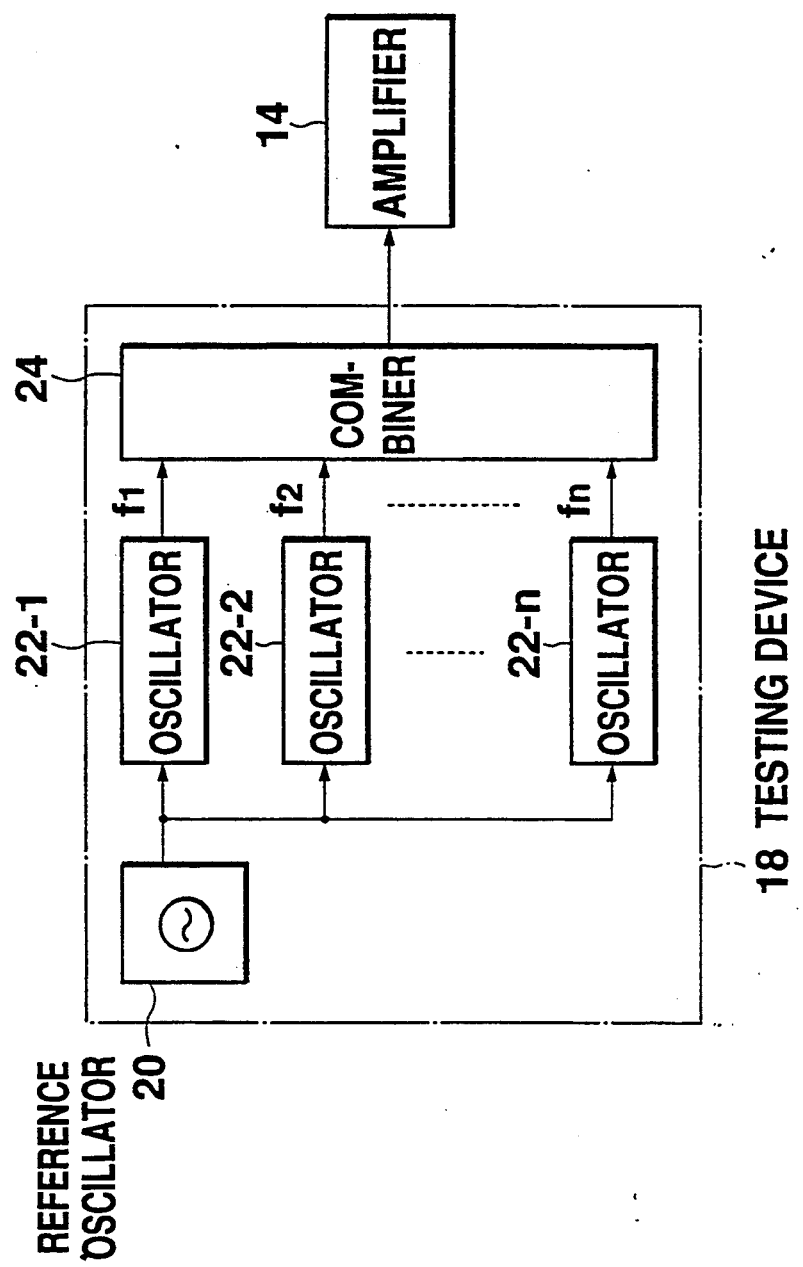
FIG. 8 is a block diagram showing the configuration of a testing device according to the related art.

Referring now to the accompanying drawings, there are shown preferred embodiments of the invention. Circuit parts identical with or similar to those previously described with reference to FIG. 8 are denoted by the same reference numerals in FIGS. 1, 2, 5, and 6, and will not be discussed again.

First embodiment

Figure 1:
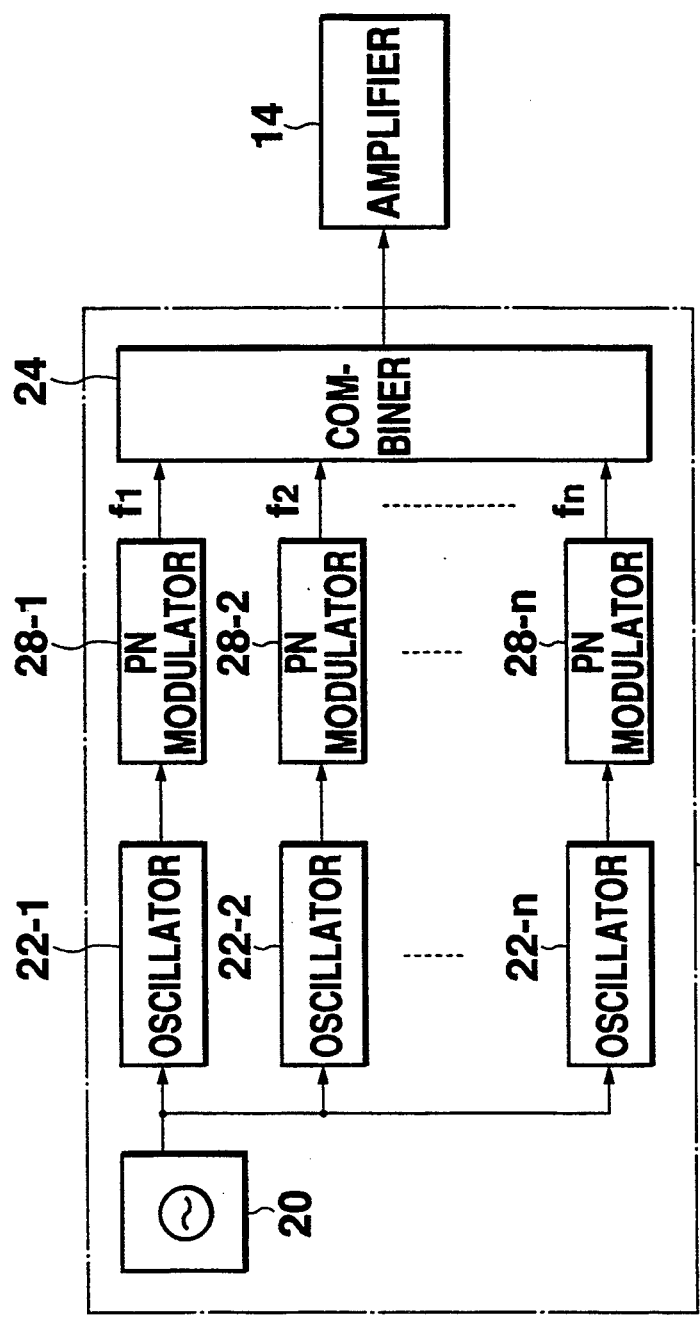
FIG. 1 is a block diagram showing the configuration of a testing device according to a first embodiment of the invention.

FIG. 1 shows the configuration of a testing device according to a first embodiment of the invention. The testing device 26 shown in the figure comprises n PN modulators 28-1, 28-2, ..., 28-n added to the testing device 18 in the related art shown in FIG. 8.

The PN modulators 28-1, 28-2, ..., 28-n, which are provided corresponding to the oscillators 22-1, 22-2, ..., 22-n respectively, phase-modulate oscillation outputs of the corresponding oscillators 22-1, 22-2, ..., 22-n according to PN code, then supply the results to a combiner 24. Series of PN codes used for PN modulation at the PN modulators 28-1, 28-2, ..., 28-n are set to different code series, and the degree of phase modulation applied by the PN code series is sufficiently small so that the frequencies $f_1, f_2, \ldots, f_n$, do not vary significantly.

Figure 2:
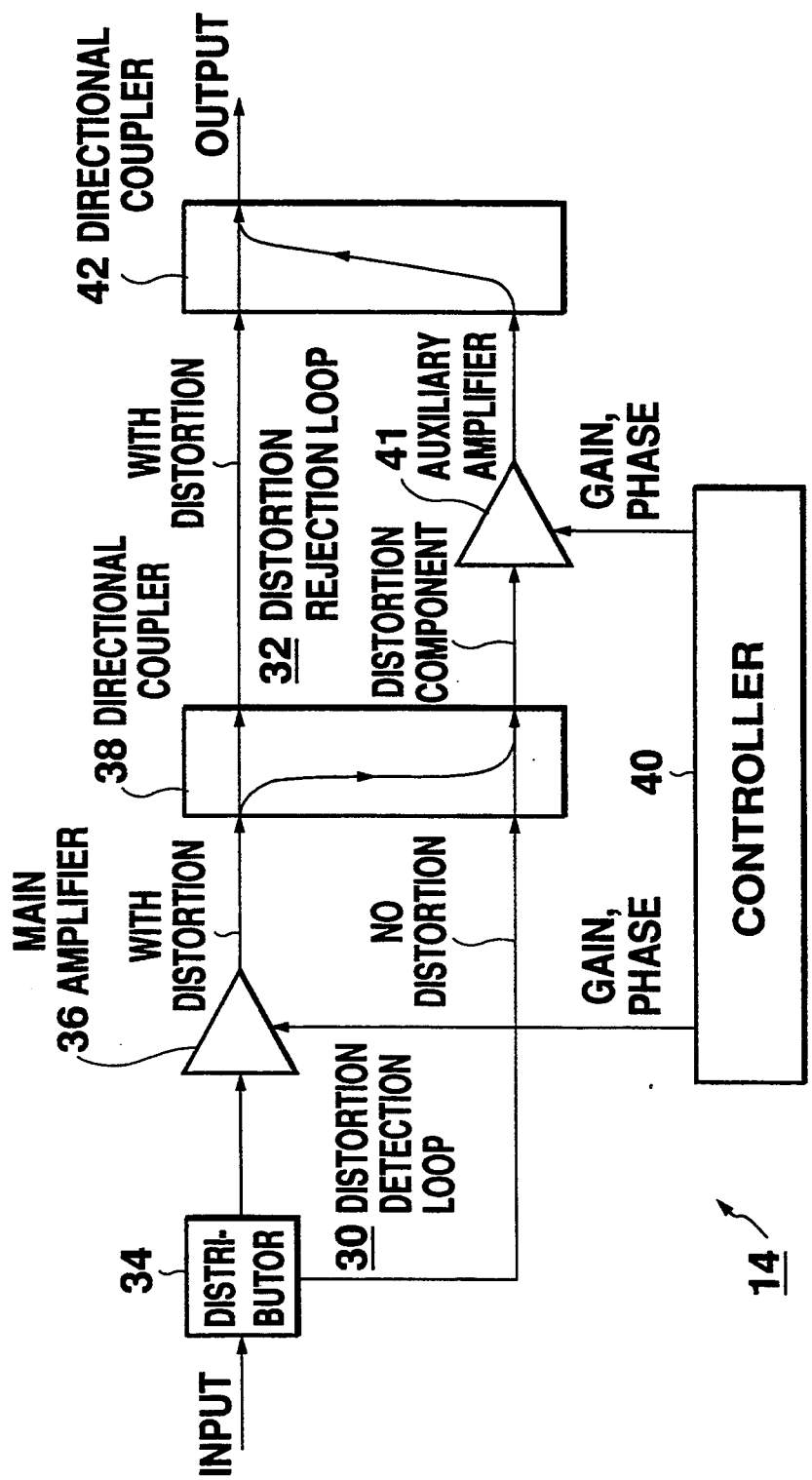
FIG. 2 is a block diagram showing a configuration example of an amplifier to be tested in the first embodiment.
Figure 3:
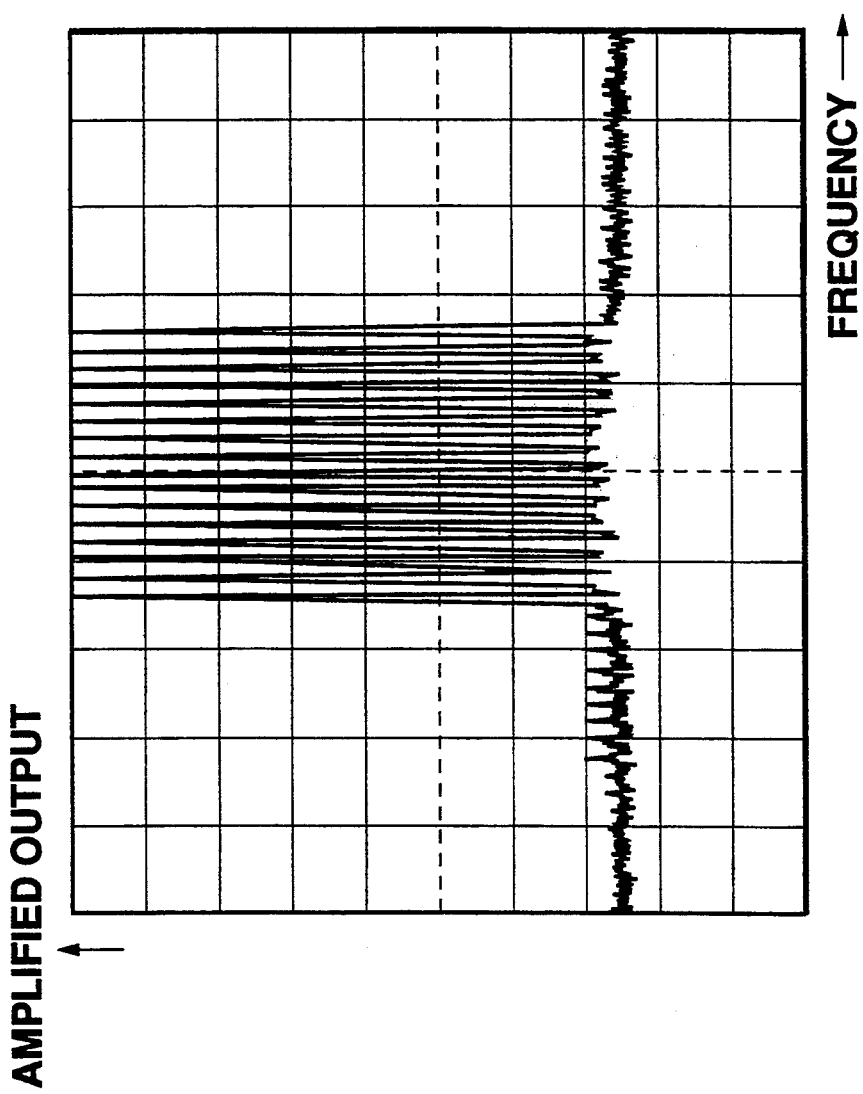
FIG. 3 is a graph showing an output spectrum of the amplifier in the first embodiment.
Figure 4:
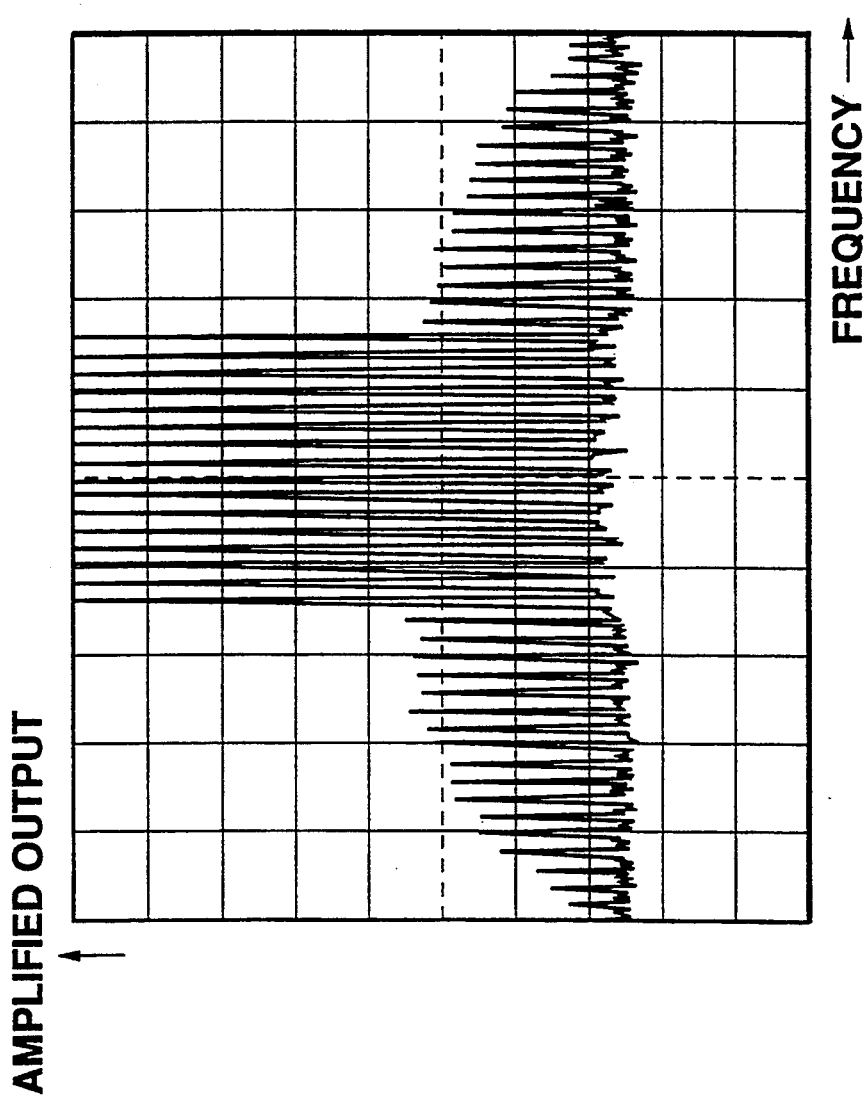
FIG. 4 is a graph showing the effect of the testing device according to the first embodiment by showing an output spectrum of an amplifier in the related art shown in Figure 8.

FIGS. 2 to 4 show the effect of the first embodiment. FIG. 2 shows a configuration example of the amplifier 14 to be tested. FIGS. 3 and 4 show output spectra of amplifiers 14 in the first embodiment and the related art respectively.

First, the amplifier 14 shown in FIG. 2 is a feed forward amplifier having a function of compensating for nonlinear distortion. The amplifier 14 comprises a distortion detection loop 30 and a distortion rejection loop 32 as feed forward loops. In the distortion detection loop 30, a distributor 34 distributes input signals to a main amplifier 36 and a directional coupler 38. The input signals amplified by the main amplifier 36 are supplied to the directional coupler 38. A Controller 40 controls gain and phase of the main amplifier 36 so that output of the main amplifier 36 and output from the directional coupler 38 become opposite in phase and the same in amplitude. The signals supplied from the main amplifier 36 to the directional coupler 38 are signals containing distortion caused by the main amplifier 36. The signals supplied from the distributor 34 directly to the directional coupler 38 are signals not containing such distortion. The directional coupler 38 outputs the former signals containing distortion to a directional coupler 42 via the distortion rejection loop 32. On the other hand, the directional coupler 38 subtracts the latter signals containing no distortion from the former signals and supplies the resultant signals to an auxiliary amplifier 41 of the distortion rejection loop 32. As described above, output of the main amplifier 36 and output from the distributor 34 to the directional coupler 38 are opposite in phase and the same in amplitude, thus the signals supplied from the directional coupler 38 to the auxiliary amplifier 41 contain only distortion components caused by the main amplifier 36. The auxiliary amplifier 41 amplifies the distortion components under the gain and phase control by the controller 40 and supplies the results to a directional coupler 42. The directional coupler 42 subtracts the output signals of the auxiliary amplifier 41 from the signals directly supplied from the directional coupler 38 and outputs signals from which distortion has been removed.

Figure 9:
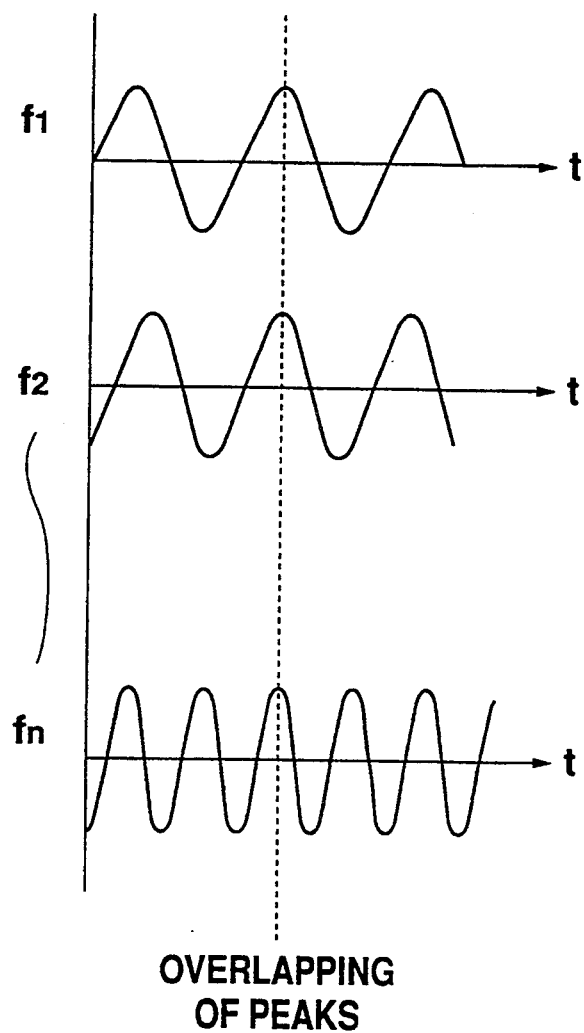
FIG. 9 is a chart showing overlapping of peaks in oscillator outputs in the related art.
Figure 10:
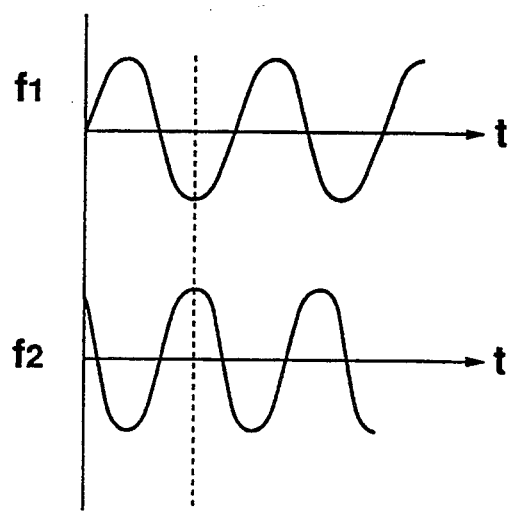
FIG. 10 is a chart showing negation of oscillator outputs in opposite phases in the related art.

If signals are supplied to the amplifier 14 discussed so far from the testing device 18 in FIG. 8, the peak power of the signals varies greatly and periodically, causing an unnecessary spectrum to appear in the output of the amplifier 14. For example, if overlapping of peaks as shown in FIG. 9 occurs, the peak power of signals supplied to the amplifier 14 becomes larger and the amplifier 14 has a heavier load. At this time, a spectrum caused by intermodulation distortion appears in high and low frequency bands of the output signals of the amplifier 14 viewed from carriers, as shown in FIG. 4. If the signals negate each other as shown in FIG. 10 and the peak power becomes smaller, the amplifier 14 has a lighter load and spectra caused by intermodulation distortion do not appear in the output signals at all (not shown). With the testing device in FIG. 8, whether the peaks overlap each other or whether the signals negate each other depends on the output phase of the reference oscillator 20 and at what point of time phase synchronization of output phases of oscillators 22-1, 22-2, ... 22-n is made.

In contrast, if oscillation outputs of the oscillators 22-1, 22-2, ..., 22-n are PN modulated as in the first embodiment, the spectra caused by intermodulation distortion can be suppressed as shown in FIG. 3, enabling the original capability of the amplifier 14 to be determined accurately. In other words, since the PN modulators 28-1, 28-2, ..., 28-n phase-modulate outputs of the oscillators 22-1, 22-2, ..., 22-n, the possibility that the peaks of a large number of carriers combined by the combiner 24 will overlap each other or that the carriers having opposite phases will negate each other becomes very low, enabling true-to-fact and accurate capability evaluation of the amplifier 14 and the base station system containing the same. Specifically, when measuring the attenuation of intermodulation distortion included in the output signals of the amplifier 14, as a way of evaluation of the performance thereof, the resultant data is provided constantly with an error of 1 dB or less. Also, only a single reference oscillator 20 is sufficient to give a reference frequency as with the related art, therefore the configuration can be simplified, leading to low costs. Phase modulation with PN code series is of little account and scarcely affects evaluation.

Second embodiment

Figure 5:
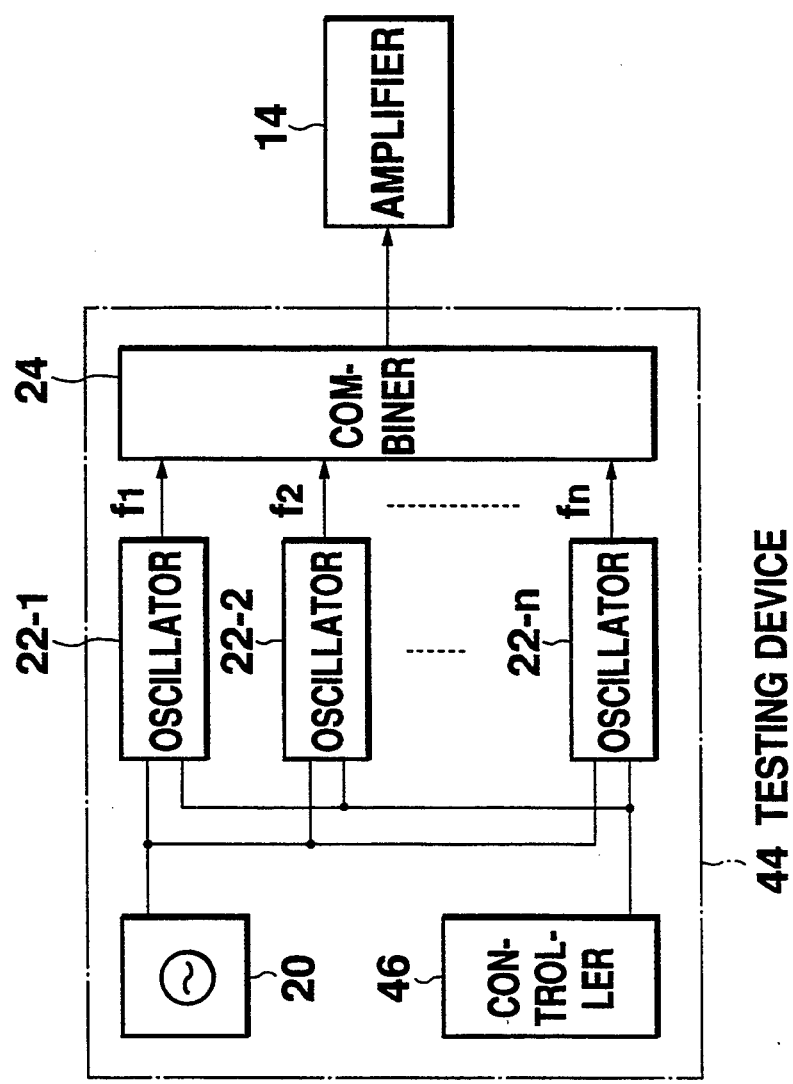
FIG. 5 is a block diagram showing the configuration of a testing device according to a second embodiment of the invention.

FIG. 5 shows the configuration of a testing device 44 according to a second embodiment of the invention, wherein a controller 46 not shown in FIG. 8 is represented. The controller 46 is a circuit for setting a division ratios at oscillators 22-1, 22-2, ..., 22-n. Circuit parts identical with or similar to those previously described in the first embodiment are denoted by the same reference numerals in the second embodiment.

The embodiment is characterized by the fact that phase fluctuation is given to oscillation output phases of the oscillators 22-1, 22-2, ..., 22-n by setting each division ratio by the controller 46. That is, the controller 46 gives fluctuation to division ratios of frequency dividers (not shown) contained in the oscillators 22-1, 22-2, ..., 22-n, thereby giving phase fluctuation to the oscillation outputs of the oscillators 22-1, 22-2, ..., 22-n. The fluctuation of the division ratio is given to each oscillator by supplying a PN code series from the controller 46. PN code series given to different oscillators are different each other. Such circuit configuration produces an effect similar to that in the first embodiment. In addition, the second embodiment requires only a modification in the software of the controller 46 used with the related art and eliminates the need for a hardware change.

Third embodiment

Figure 6:
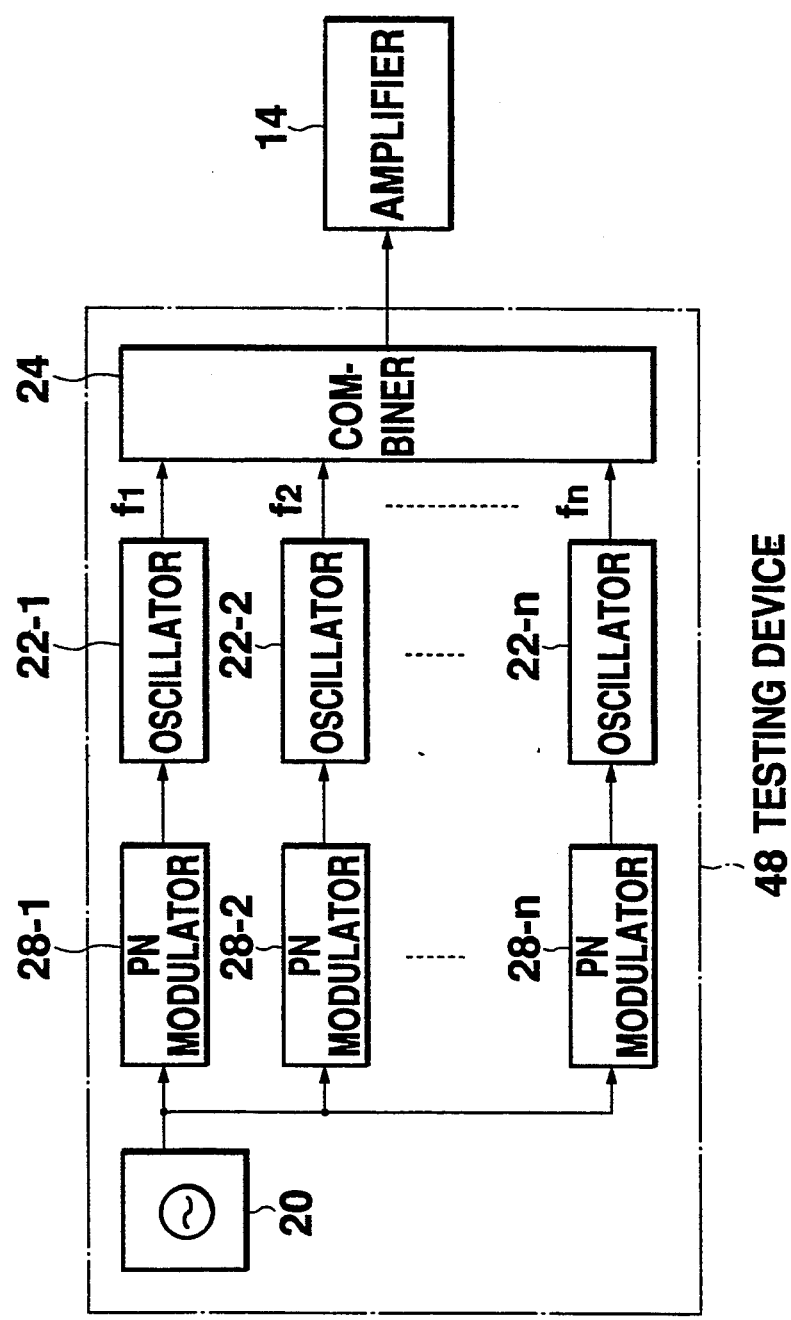
FIG. 6 is a block diagram showing the configuration of a testing device according to a third embodiment of the invention.
Figure 7:
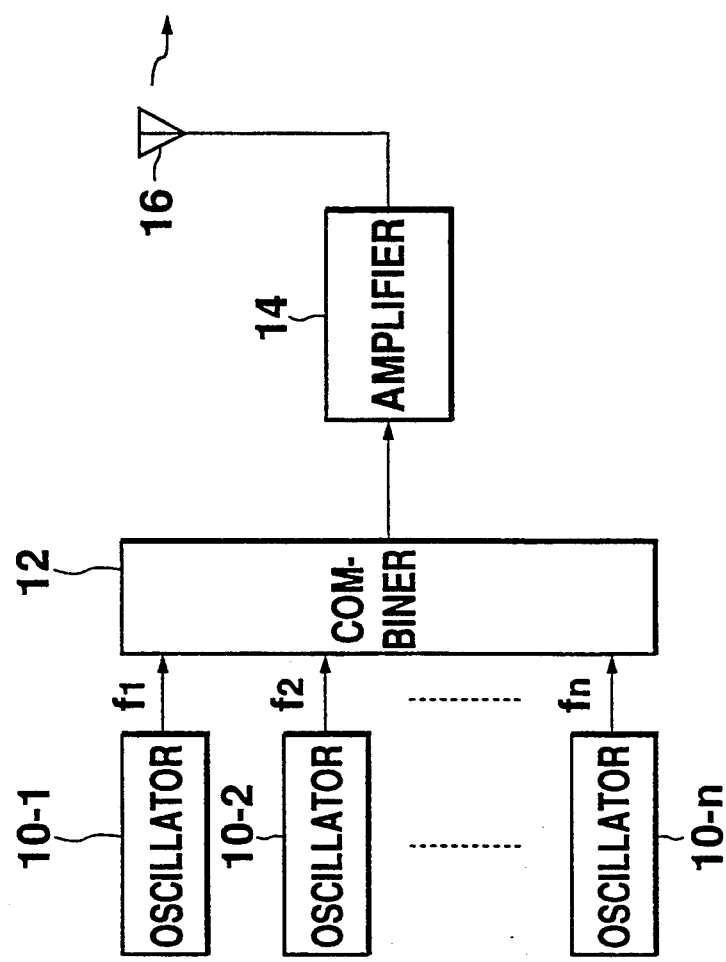
FIG. 7 is a schematic block diagram of a base station system for mobile communication.

FIG. 6 shows the configuration of a testing device 48 according to a third embodiment of the invention, wherein circuit parts identical with or similar to those previously described in the first embodiment are denoted by the same reference numerals. In the third embodiment, PN modulators 28-1, 28-2, ..., 28-n, which are located preceding oscillators 22-1, 22-2, ..., 22-n, PN modulate oscillation output of the reference oscillator 20 with different PN code series and supply the PN modulated signals to their corresponding oscillators 22-1, 22-2, ..., 22-n. The third embodiment also produces an effect similar to that of the first embodiment.

Miscellaneous

In the description given so far, amplifiers in a base station system for mobile communication have been tested or evaluated, but amplifiers involved in other applications may also be tested. The invention can be applied to systems, each of which generates a plurality of carriers and amplifies them simultaneously, such as multicarrier transmission with an optical fiber and base stations of CATV and base stations used in radio communication systems implemented as digital multichannel access system. n of n waves of carriers may be any integer of 2 or greater, such as eight, 16, or 24. Further, carrier frequencies are not limited; for example, frequencies in VHF and UHF bands can be used as carriers. In addition, means for giving phase fluctuation is not limited. "Phase modulation" mentioned in the specification shall contain frequency modulation. When phase fluctuation is applied by frequency or phase modulation, a modulation system other than the PN modulation can also be used. The method for giving fluctuations to the division ratios is not limited to the method using PN codes, i.e. other known methods are also applicable. The objects to the tested are not limited to the configuration shown in FIG. 2.

As described above, the testing device of the invention is adapted to give a different phase fluctuation to each of the oscillation outputs of the oscillators, can thus prevent peaks from overlapping each other and can evaluate or test the performance of an amplifier to be tested more accurately. Also, the configuration of the testing device may be simplified.

What is claimed is:

1. A device for testing or evaluating an amplifier comprising:
   reference oscillation means for generating a reference signal of a predetermined frequency;
   oscillation means for generating test carriers having different frequencies using the reference signal as a phase reference;
   means for combining the test carriers and supplying a resulting signal to the amplifier to be tested; and
   phase fluctuation means for differently fluctuating each phase of the test carriers.

2. The device as claimed in claim 1, wherein said phase fluctuation means includes a plurality of modulators for applying random phase modulation or random frequency modulation to the test carriers.

3. The device as claimed in claim 2, wherein said modulators modulate the test carriers with different pseudo noise codes.

4. The device as claimed in claim 1, wherein said phase fluctuation means includes a plurality of modulators for applying random phase modulation or random frequency modulation to the reference signal.

5. The device as claimed in claim 4, wherein said modulators modulate the reference signal with different pseudo noise codes.

6. The device as claimed in claim 1, wherein
said oscillation means generates the test carriers by dividing the reference signal into different division ratios; and
said phase fluctuation means includes control means for fluctuating the division ratios.

7. The device as claimed in claim 6, wherein said control means fluctuates the division ratios using different pseudo noise codes.

8. The device as claimed in claim 1, wherein said amplifier to be tested includes a main amplifier which amplifies the resulting signal supplied from said testing device, means for detecting distortion occurring in said main amplifier, and means for removing the detected distortion from an output of said main amplifier.

9. A testing device comprising:
a reference oscillator oscillating at a predetermined frequency;
a plurality of oscillators using an oscillation output of said reference oscillator as a reference oscillation phase, said plurality of oscillators oscillating at different frequencies;
a combiner combining oscillation outputs of said plurality of oscillators and supplying a resulting signal to an amplifier to be tested; and
phase fluctuation means for differently fluctuating each oscillation output phase of said plurality of oscillators, the amplifier being tested or evaluated by supplying a plurality of frequency components at a same time.

10. A method of testing or evaluating an amplifier comprising the steps of:

generating a reference signal of a predetermined frequency;
generating test carriers having different frequencies by using the reference signal as a phase reference;
combining the test carriers and supplying a resulting signal to the amplifier to be tested; and
differently fluctuating each phase of the test carriers.

11. The method as claimed in claim 10, wherein said phases are fluctuated by applying random phase modulation or random frequency modulation to said test carriers.

12. The method as claimed in claim 11, wherein said modulation is applied with different pseudo noise codes.

13. The method as claimed in claim 10, wherein said phases are fluctuated by applying random phase modulation or random frequency modulation to said reference signal.

14. The method as claimed in claim 13, wherein said modulation is applied with different pseudo noise codes.

15. The method as claimed in claim 10, wherein said reference signal is divided into different division ratios for generating said test carriers, said phase fluctuation comprising fluctuating said division ratios.

16. The method as claimed in claim 15, wherein different pseudo noise codes are used to fluctuate said division ratios.

17. The method as claimed in claim 10, further comprising the steps of: inputting the resulting signal into a main amplifier which amplifies the resulting signal, detecting distortion occurring in said main amplifier, and removing the detected distortion from an output of said main amplifier.

* * * * *